(12) United States Patent
Margabandu et al.

(10) Patent No.: US 8,797,061 B2
(45) Date of Patent: Aug. 5, 2014

(54) PARTIAL RECONFIGURATION CIRCUITRY

(75) Inventors: Balaji Margabandu, Santa Clara, CA (US); Dirk A. Reese, Campbell, CA (US); Leo Min Maung, Fremont, CA (US); Ninh D. Ngo, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/481,506

(22) Filed: May 25, 2012

(65) Prior Publication Data

US 2013/0162290 A1 Jun. 27, 2013

Related U.S. Application Data

(60) Provisional application No. 61/578,864, filed on Dec. 21, 2011.

(51) Int. Cl.
*H03K 19/173* (2006.01)
*H03K 19/177* (2006.01)

(52) U.S. Cl.
CPC ...... *H03K 19/17756* (2013.01); *H03K 19/1776* (2013.01)
USPC .................................. 326/38; 326/41; 326/47

(58) Field of Classification Search
USPC .................. 365/51, 63; 711/117, 153, 156
See application file for complete search history.

(56) References Cited

U.S. PATENT DOCUMENTS

| | | | |
|---|---|---|---|
| 3,824,564 A | 7/1974 | Wegner | |
| 6,255,848 B1 * | 7/2001 | Schultz et al. | 326/41 |
| 6,738,962 B1 * | 5/2004 | Flaherty et al. | 326/38 |
| 6,810,514 B1 * | 10/2004 | Alfke et al. | 326/38 |
| 7,200,235 B1 * | 4/2007 | Trimberger | 380/277 |
| 7,227,378 B2 * | 6/2007 | Blodget et al. | 326/38 |
| 7,328,335 B1 * | 2/2008 | Sundararajan et al. | 713/1 |
| 7,634,713 B1 | 12/2009 | Ngo | |
| 7,906,984 B1 * | 3/2011 | Montminy et al. | 326/10 |
| 7,973,556 B1 * | 7/2011 | Noguera Serra et al. | 326/38 |
| 8,390,325 B2 * | 3/2013 | Box et al. | 326/40 |
| 8,415,974 B1 * | 4/2013 | Lysaght | 326/39 |
| 2005/0242836 A1 | 11/2005 | Goetting et al. | |

OTHER PUBLICATIONS

Ngo, U.S. Appl. No. 12/608,835, filed Oct. 29, 2009.
Ngo, U.S. Appl. No. 11/436,967, filed May 16, 2006.
Tan, Jun Pin, et al., U.S. Appl. No. 12/814,713, filed Jun. 14, 2010.
Pedersen, Bruce B., U.S. Appl. No. 12/407,750, filed Mar. 19, 2009.

* cited by examiner

*Primary Examiner* — Alexander H Taningco
*Assistant Examiner* — Nelson Correa
(74) *Attorney, Agent, or Firm* — Treyz Law Group; Jason Tsai

(57) ABSTRACT

Integrated circuits may include partial reconfiguration (PR) circuitry for reconfiguring a portion of a memory array. The PR circuitry may include a host circuit, a control circuit, an address register, and first, second, and third data registers. The host circuit may send a series of PR instructions to the control circuit. The control circuit may include a decompression circuit for decompressing compressed instructions, a decryption circuit for decrypting encrypted instructions, an error checking circuit for detecting errors in the instructions, and a logic circuit. The address register may select a desired frame. The selected frame may be loaded into the third data register. The contents of the third data register may be shifted into the first data register. The contents of the first data register may be modified according to a desired logic function using the logic circuit, shifted into the second data register, and written into the selected frame.

19 Claims, 11 Drawing Sheets

| INSTRUCTION TYPE | DESCRIPTION |
|---|---|
| SKIP_LEFT | SKIP CURRENT FRAME. MOVE ADDRESS REGISTER POINTER LEFT. |
| SKIP_RIGHT | SKIP CURRENT FRAME. MOVE ADDRESS POINTER RIGHT. |
| CLEAR_AR | CLEAR ADDRESS REGISTER (E.G., NO FRAMES ARE SELECTED). |
| SELECT_FRAME0 | SELECT FIRST FRAME OF MEMORY ARRAY. |
| LOAD_FIRST_PR_FRAME | LOAD DRLA WITH CONTENTS OF FIRST FRAME IN PR REGION. |
| WRITE_LAST_PR_FRAME | WRITE CONTENTS OF DRB INTO LAST FRAME IN PR REGION. |
| AND | $D_{new} = D_{old} \cdot D_{pr}$ |
| OR | $D_{new} = D_{old} + D_{pr}$ |
| XOR | $D_{new} = D_{old} \oplus D_{pr}$ |
| SCRUB | $D_{new} = D_{pr}$ |
| PR_DONE | PR PROCESS IS COMPLETE. |

202 { AND, OR, XOR, SCRUB }

FIG. 6

| PR FRAME TYPE | DESCRIPTION |
|---|---|
| SINGLE | PR IS PERFORMED ON ONLY ONE FRAME. |
| FIRST | FIRST FRAME IN PR REGION (WHEN PR IS PERFORMED ON MORE THAN ONE FRAME). |
| LAST | LAST FRAME IN PR REGION (WHEN PR IS PERFORMED ON MORE THAN ONE FRAME). |
| REGULAR | FRAME IN PR REGION THAT IS NEITHER THE FIRST FRAME NOR THE LAST FRAME (WHEN PR IS PERFORMED ON MORE THAN ONE FRAME). |

FIG. 7

PARTIAL RECONFIGURATION CIRCUITRY

This application claims the benefit of provisional patent application No. 61/578,864, filed Dec. 21, 2011, which is hereby incorporated by reference herein in its entirety.

BACKGROUND

This relates to integrated circuits and more particularly, to circuitry for performing partial reconfiguration on integrated circuits such as programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements to configure the devices to perform the functions of the custom logic circuit.

Memory elements are often formed using random-access-memory (RAM) cells. Because the RAM cells are loaded with configuration data during device programming, the RAM cells are sometimes referred to as configuration memory or configuration random-access-memory cells (CRAM).

During normal operation of a programmable device, loaded CRAM cells produce static output signals that are applied to the gates of transistors (e.g., pass transistors). The CRAM output signals turn some transistors on and turn other transistors off. This selective activation of certain transistors on the programmable device customizes the operation of the programmable device so that the programmable device performs its intended function.

Configuration data may be supplied to a programmable device in the form of a configuration bit stream. After a first configuration bit stream has been loaded onto a programmable device, the programmable device may be reconfigured by loading a different configuration bit stream in a process known as reconfiguration. An entire set of configuration data is often loaded during reconfiguration. However, it may sometimes be advantageous to reconfigure only a portion of the configuration bits using a process known as partial reconfiguration.

SUMMARY

An integrated circuit that includes memory elements and partial reconfiguration circuitry operable to reconfigure a selected portion of the memory elements is provided. The memory elements may be arranged in rows and columns and may collectively be referred to as a memory array.

The partial reconfiguration (PR) circuitry may include a PR host circuit, a PR control circuit, an address register, and first, second, and third data registers. The PR host circuit may be used to perform a handshake procedure with the PR control circuit to initialize the PR control circuit and may provide a series of partial reconfiguration instructions to the PR control circuit. In some embodiments, the PR instructions may be compressed and/or encrypted. In such scenarios, PR control circuit may include circuitry operable to decompressed and/or decrypt the instructions.

The PR control circuit may include an error checking circuit configured to determine whether each PR instruction contains an error. If a current PR instruction is erroneous, the error checking circuit may provide an asserted error signal to the PR host circuit to alert the host circuit of the error. When the host circuit receives an asserted error signal, the host circuit may resend the erroneous instruction or may resend the entire series of PR instructions. If the current PR instruction does not contain any error, the error checking circuit may provide a deasserted error signal to the PR host circuit and the current instruction may be executed.

The PR control circuit may direct the address register to select a desired row (or frame) in the memory array for a read access or a write access. In one illustrative sequence of operations, a selected row of memory elements may be read and stored in the first data register. The first data register may subsequently load its contents into the second data register in parallel. The contents of the second data register may then be serially shifted out into the PR control circuit. The PR control circuit may modify the shifted data contents based on data bits provided in the current PR instruction (e.g., the data bits from the second data register and the data bits in the current instruction may be processed using a specified logic function to produce a modified data bit). The modified content may then be serially shifted back into the second data register.

The contents of the second data register may then be shifted into the third data register in parallel. The contents of the third data register may then be loaded into the selected row of memory elements. The address register may then be used to select a different row of memory elements for reconfiguration.

Further features of the present invention, its nature and various advantages will be more apparent from the accompanying drawings and the following detailed description.

BRIEF DESCRIPTION OF THE DRAWINGS

FIG. 6 is a table of illustrative partial reconfiguration instruction types in accordance with an embodiment of the present invention.

FIG. 7 is a table of illustrative partial reconfiguration frame types in accordance with an embodiment of the present invention.

DETAILED DESCRIPTION

Embodiments of the present invention relate to integrated circuits and more particularly, to integrated circuits with memory elements. Integrated circuits that contain memory elements may include memory chips, digital signal processing circuits, microprocessors, application specific integrated circuits (ASICs), application specific standard products (ASSPs), programmable integrated circuits such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), or other suitable integrated circuits.

Integrated circuits such as programmable integrated circuits use programmable memory elements to store configuration data. During programming of a programmable integrated circuit, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
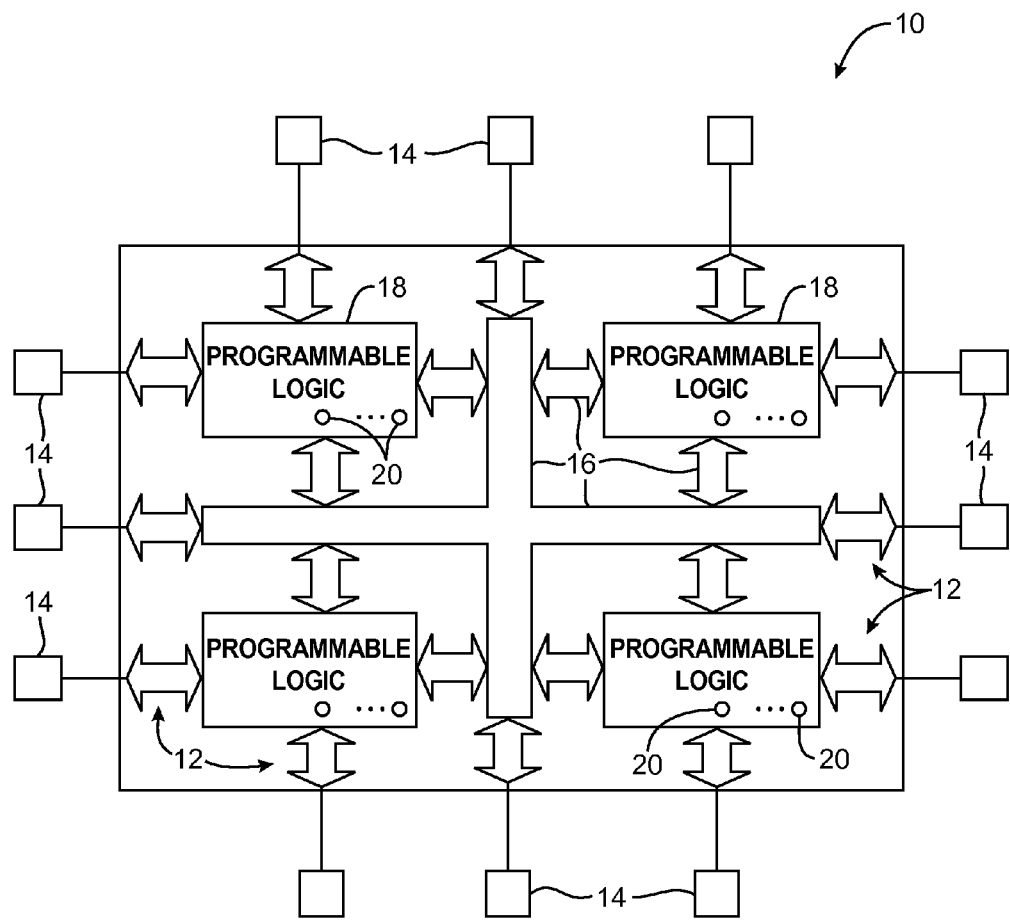
FIG. 1 is a diagram of an illustrative programmable integrated circuit in accordance with an embodiment of the present invention.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
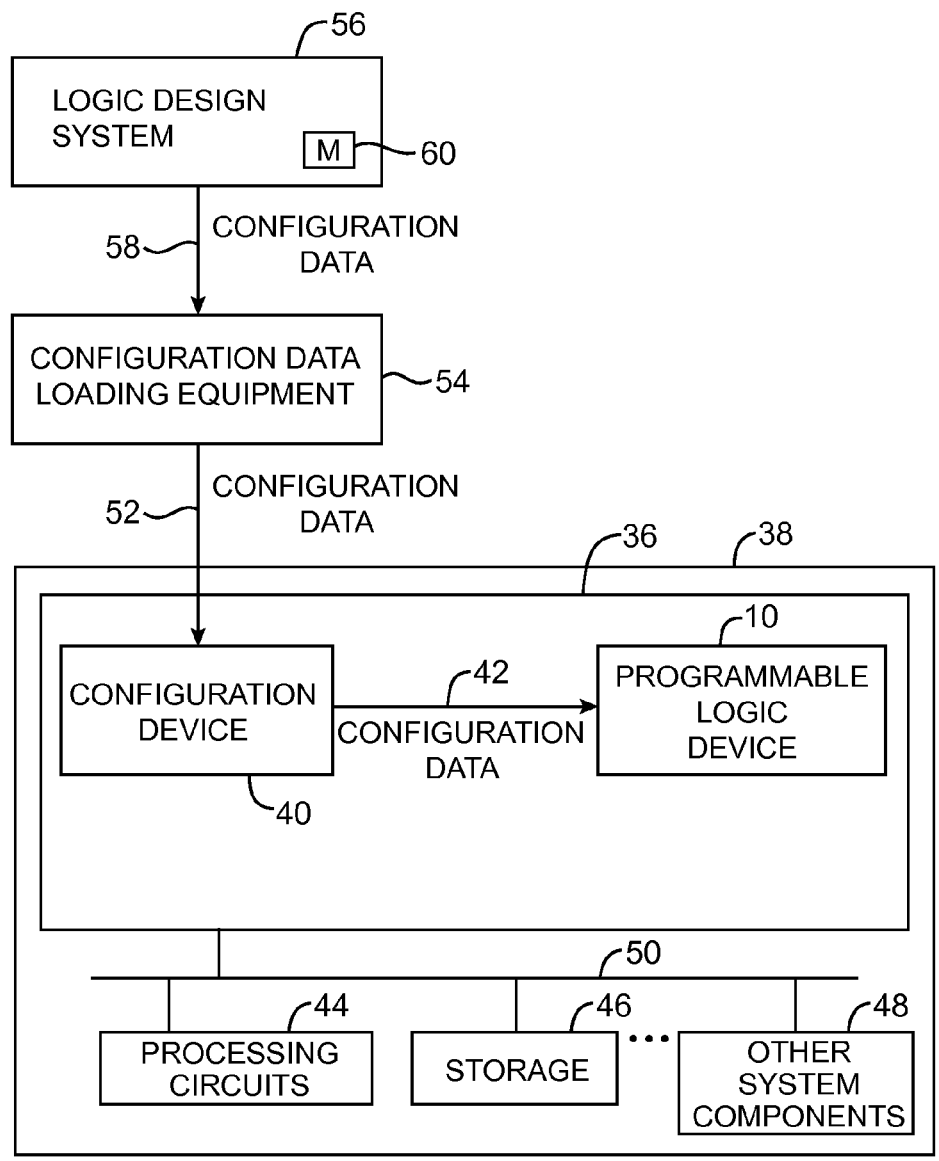
FIG. 2 is a diagram showing how configuration data is created by a logic design system and loaded into a programmable device to configure the device for operation in a system in accordance with an embodiment of the present invention.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

Figure 3:
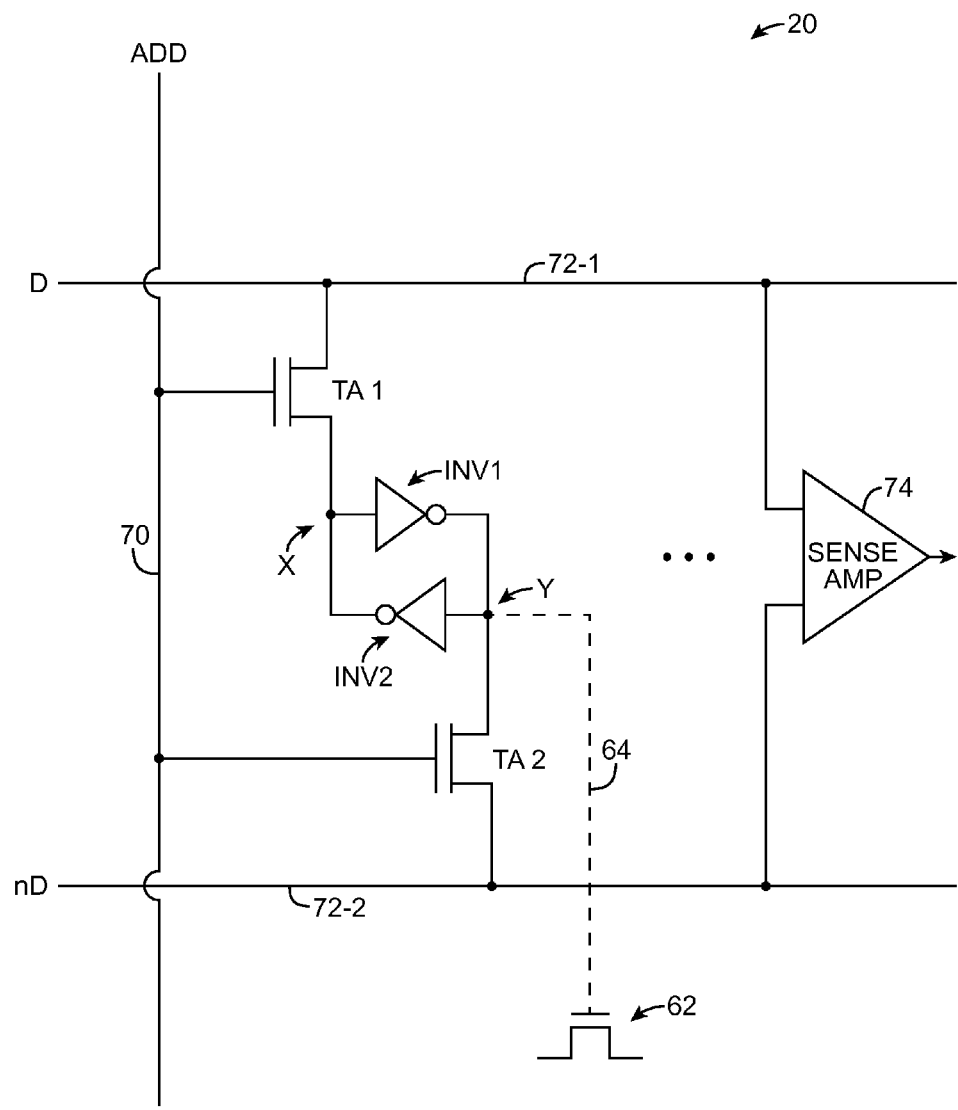
FIG. 3 is a circuit diagram of an illustrative memory element in accordance with an embodiment of the present invention.

FIG. 3 is a circuit diagram of CRAM cell 20. As shown in FIG. 1, cell 20 may include a pair of cross-coupled inverters (e.g., a latch) and two access transistors. The latch may include inverters INV1 and INV2. Inverter INV1 may have an output that is coupled to an input of inverter INV2, whereas inverter INV2 may have an output that is coupled to an input of inverter INV1. Inverters INV1 and INV2 cross-coupled in this way form a storage portion for cell 20.

The storage portion of cell 20 may be a bi-stable element configured to store data at first and second data storage nodes (i.e., first data storage node X and second data storage node Y). The output of inverter INV1 may be coupled to second data storage node Y, whereas the output of inverter INV2 may be coupled to first data storage node X (see, e.g., FIG. 3).

Access transistors such as access transistors TA1 and TA2 may be connected to the storage portion of memory cell 20 to perform read and write operations. As shown in FIG. 3, access transistor TA1 may be coupled between a first data line such as first data line 72-1 (e.g., a true data line on which true data signal D is conveyed) and first data storage node X, whereas access transistor TA2 may be coupled between a second data line such as second data line 72-2 (e.g., a complementary data line on which complement data signal nD is conveyed) and second data storage node Y. Transistors TA1 and TA2 may each have a gate that is coupled to an address line 70 (sometimes referred to as a word line) on which address signal ADD is conveyed. Transistors TA1 and TA2 may therefore sometimes be referred to as address transistors.

During normal operation (e.g., a normal operating mode in which cell 20 holds configuration data), address signal ADD is deasserted (e.g., address signal ADD is pulled low) to turn off access transistors TA1 and TA2 so that the storage portion of cell 20 holds stored data values at data storage nodes X and Y. For example, cell 20 holding a "0" may have first data storage node X at logic "1" and second data storage node Y at logic "0."

During read operations, data lines 72-1 and 72-2 may be precharged (e.g., data signals D and nD may be precharged to a high voltage). Address signal ADD may then be asserted (e.g., address signal ADD may be raised high) to enable access transistors TA1 and TA2 to read data from cell 20. Sensing circuitry such as sense amplifier 74 having inputs that are coupled to data lines 72-1 and 72-2 may be used to determine whether cell 20 is storing a "0" (e.g., whether storage node Y is storing a "0") or a "1" (e.g., whether storage node Y is storing a "1").

During write operations, desired data values may be presented on data lines 72-1 and 72-2 while address signal ADD is asserted to enable access transistor TA1 and TA2 to write the desired data values into cell 20. For example, signal D on line 72-1 may be driven to logic "1" while signal nD on line 72-2 may be driven to logic "0" to write in a "0" into cell 20.

The signals that are supplied to memory elements 20 may sometimes be collectively referred to as control signals. In particular contexts, some of these signals may be referred to as power signals, clear signals, data signals, address signals, etc. These different signal types are not mutually exclusive.

Each memory cell 20 may supply a corresponding output signal on a corresponding output path 64. Output path 64 may be coupled to data storage node Y. Each output signal is a static output control signal that may be used in configuring a corresponding transistor such as transistor 62 (e.g., the output signal may be used to control a gate of corresponding transistor 62) or other circuit element in an associated programmable logic circuit. Transistor 62 may sometimes be referred to as a pass transistor or a pass gate. The state of transistor 62 (off or on) controls whether signals are allowed to pass between its source-drain terminals.

Memory cell 20 shown in FIG. 3 is merely illustrative. The storage portion of memory cell 20 may have more than two cross-coupled inverters or may be formed using any suitable number of transistors forming a latch. If desired, memory cell 20 may be implemented using single-ended read/write schemes, may include a clear transistor (e.g., a transistor that may be globally enabled to clear the contents of the memory cells on device 10), etc.

After device 10 is initially loaded with a set of configuration data (e.g., using configuration device 40 as described in connection with FIG. 2), device 10 may be reconfigured by loading a different set of configuration data. Sometimes it may be desirable to reconfigure only a portion of the memory cells on device 10 via a process sometimes referred to as partial reconfiguration. As memory cells are typically arranged in an array, partial reconfiguration can be performed by writing new data values only into a selected rectangular region in the array.

Figure 4:
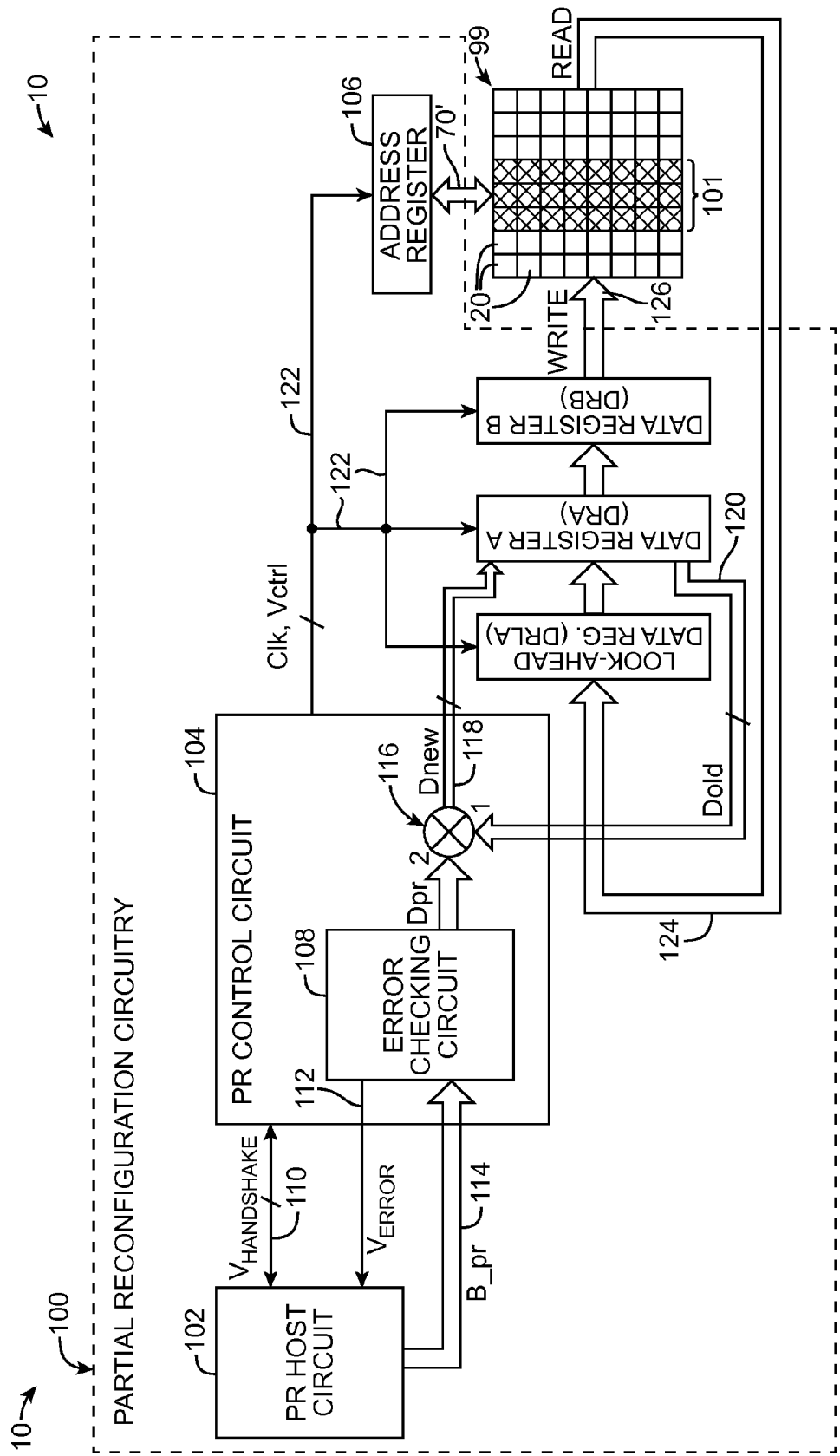
FIG. 4 is a diagram of an illustrative integrated circuit having an array of memory elements and partial reconfiguration circuitry that can be used for performing partial reconfiguration on the array of memory elements in accordance with an embodiment of the present invention.

FIG. 4 is a diagram of an integrated circuit 10 that includes an array of memory cells 20 such as memory array 99. In general, there may be hundreds or thousands of rows and columns in memory array 99. Memory array 99 may be one of a number of memory arrays on device 10, may be a subarray that is part of a larger array, or may be part of any other suitable group of memory cells 20.

As shown in FIG. 4, device 10 may include partial reconfiguration circuitry 100 that is coupled to memory array 99. Partial reconfiguration circuitry 100 may be used to reconfigure selected portions of memory array 99 while leaving portions of array 99 other than the selected portions in their original configured state. Partial reconfiguration (PR) circuitry 100 may include a partial reconfiguration host circuit 102, a partial reconfiguration control circuit 104, an address register 106, a first data register sometimes referred to herein as data register A (DRA), a second data register sometimes referred to herein as data register B (DRB), and a third data register sometimes referred to herein as look-ahead data register (DRLA). In another suitable embodiment of the present invention, PR host circuit 102 may be external to device 10 and may serve as a separate component for interfacing with control circuit 104 during partial reconfiguration operations.

Each memory cell 20 in a row of memory cells within array 99 may be coupled to an associated address line 70 over which a corresponding address signal ADD is provided. For example, each memory cell 20 in a first row of memory cells may be coupled to a first address line over which address signal ADD1 is supplied; each memory cell 20 in a second row of memory cells may be coupled to a second address line over which address signal ADD2 is supplied; . . . , and each memory cell 20 in an $n^{th}$ row of memory cells may be coupled to an $n^{th}$ address line over which address signal ADDn is supplied. Memory cells 20 that are coupled to a common address line (e.g., memory cells from the same row within array 99) may collectively be referred to as a "frame," a frame of memory, or a memory frame. Each of the different address lines 70 may be coupled to address register 106 (as shown by path 70').

Address register 106 may be configured to supply desired address signals (i.e., address signals ADD1-ADDn) to the respective memory frames in array 99. Address register 106 may supply only a single asserted address signal on a selected one of the address lines at any point in time (e.g., address register 106 is configured to select one frame at a time). Address register 106 may, as an example, be a shift register formed from a series of flip-flops each of which is used to provide a corresponding address signal at its output. Only a single given flip-flop in the series of flip-flips stores a logic "1" while flip-flops other than the given flip-flop store logic zeros. If desired, the logic "1" may be shifted to any other flip-flop in the series of flip-flops as long as only one flip-flop is storing the logic "1" (i.e., the asserted address signal).

Each memory cell 20 in a column of memory cells within array 99 may be coupled to an associated pair of data lines 72 (e.g., data lines 72-1 and 72-2). Data lines 72 may sometimes be referred to as bit lines. For example, each memory cell 20 in a first column of memory cells may be coupled to a first pair of data lines; each memory cell 20 in a second column of memory cells may be coupled to a second pair of data lines; ..., and each memory cell 20 in an $m^{th}$ column of memory cells may be coupled to an $m^{th}$ pair of data lines.

Register DRB may be coupled to the respective columns of memory cells via write driver circuits (as shown by path 126). Register DRB may be configured to store data values that are to be written into a selected frame in memory array 99 using the write driver circuits. For example, register DRB may include a first storage element that supplies a first data value to a selected memory cell in the first column of memory cells via a first write driver, a second storage element that supplies a second data value to a selected memory cell in the second column of memory cells via a second write driver, a third storage element that supplies a third data value to a selected memory cell in the third column of memory cells, etc. Arranged in this way, register DRB may serve to store data bits that can be loaded into a selected memory frame during partial reconfiguration operations.

Each column of memory cells may be coupled to a respective storage element in register DRLA via an associated read sensing circuit (as shown by path 124). Register DRLA may be configured to store data values that are read from a selected frame in memory array 99 using the read sensing circuits (see, e.g., sense amplifiers 74 of FIG. 3). For example, register DRLA may include a first storage element operable to receive a first read value from a selected memory cell in the first column of memory cells via a first sense amplifier 74, a second storage element operable to receive a second read value from a selected memory cell in the second column of memory cells via a second sense amplifier 74, a third storage element operable to receive a third read value from a selected memory cell in the third column of memory cells via a third sense amplifier 74, etc. Arranged in this way, register DRLA may serve to store data bits that are read out of a selected memory frame during partial reconfiguration operations.

The terms "rows" and "columns" merely represent one way of referring to particular groups of cells 20 in memory array 99 and may sometimes be used interchangeably. If desired, other patterns of lines may be used in memory array 99. For example, different numbers of power supply signals, data signals, and address signals may be used.

Register DRA may be coupled between register DRLA and register DRB. In one suitable step during partial reconfiguration, address register 106 may be used to select a frame of memory for readout. The read data values of the selected frame may be stored in register DRLA. In another suitable step, the contents of register DRLA may be transferred to register DRLA (e.g., the data bits stored in register DRLA may be shifted in parallel into register DRA). In another suitable step, the contents of register DRA may be modified based on new data values that are provided from PR host circuit 102. In another suitable step, the modified contents of register DRA may be transferred to register DRB (e.g., the data bits stored in register DRA may be shifted in parallel into register DRB). The modified data values that have been shifted into register DRB may then be written into the selected frame using the associated write drivers. Generally, only a portion of frames within memory array 99 is reconfigured in this way (e.g., only one or more portion of the current user logic is reconfigured without affecting other logic portions that do not need to be changed). If desired, the entire memory array 99 may be reconfigured using this approach.

The operation of address register 106, register DRA, register DRB, and register DRLA may be controlled using signals such as clock signal Clk and control signals Vctrl provided from PR control circuit 104 via path 122. The example of FIG. 4 in which three data registers DRA, DRB, and DRLA are used is merely illustrative and does not serve to limit the scope of the present invention. If desired, partial reconfiguration circuitry 100 may include less than three data registers, more than three data register, and may include an address decoder in place of a shift register.

Host circuit 102 may be configured to provide a partial reconfiguration bit stream Bpr to control circuit 104 via path 114. Bit stream Bpr may be provided from an off-chip source (e.g., from configuration device 40 of FIG. 2) to host circuit 102 via input-output pin 14. Bit stream Bpr may include a series of instructions each of which includes information useful for directing the operation of control circuit 104 during partial reconfiguration operations. Circuit 102 may exchange handshake signals $V_{HANDSHAKE}$ with circuit 104 via path 110 prior to sending stream Bpr. This handshaking process serves to initialize both circuits 102 and 104 to desired starting states and may, as an example, configure address register to assert the address signal associated with the first frame in array 99 (e.g., the first frame may be selected upon completion of the handshaking procedure).

Figure 5:
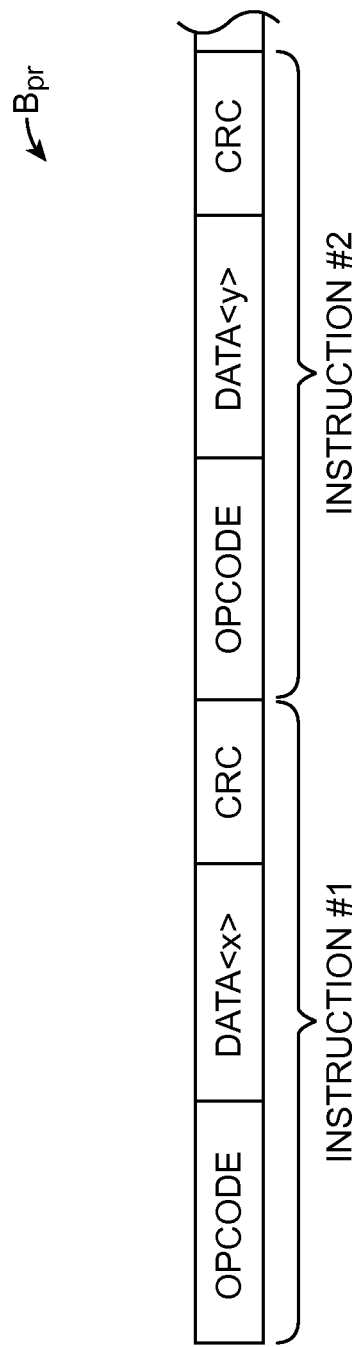
FIG. 5 is a diagram of an illustrative series of partial reconfiguration instructions in accordance with an embodiment of the present invention.

Control circuit 104 may include an error checking circuit 108 configured to receive stream Bpr and to check whether the instructions in stream Bpr contain any error. FIG. 5 is a diagram of illustrative bit stream Bpr formed from a sequence of instructions. As shown in FIG. 5, each PR instruction may include at least an opcode (or operation code) that specifies the type of operation to be executed, data bits associated with that particular type of operation, and cyclic redundancy check (CRC) bits. Different instructions may include data of different bit lengths. The number of errors that can be detected is determined by the type of error-checking mechanism that is used by error checking circuit 108. As an example, error checking circuit 108 may be implemented using a 16-bit polynomial as shown in equation (1).

$$G(x)=x^{16}+x^{15}+x^2+1 \tag{1}$$

The CRC bits in a given instruction may be computed by dividing the raw data (e.g., the opcode and the corresponding data bits) in the given instruction by polynomial G(x). In the example of equation (1), polynomial G(x) may have a digital representation that is equal to 11000000000000101. The CRC bits may be equal to the remainder of the resulting polynomial division. In general, the length of the raw data is greater than the length of the CRC polynomial.

Upon receiving an instruction from host circuit 102, control circuit 104 may recompute the CRC bits (sometimes referred to as check values) to determine whether the raw data has been inadvertently corrupted. Error checking circuit 108 may produce a corresponding error signal $V_{ERROR}$ back to host circuit 102 via path 112. If the recomputed check values match the CRC bits attached in the given instruction, error checking circuit 108 may keep $V_{ERROR}$ deasserted. If the recomputed check values fail to match the CRC bits attached in the given instruction, an error is detected, and error checking circuit 108 may assert signal $V_{ERROR}$.

Circuit 108 may perform error checking on a per instruction basis. To prevent undesired corruption of memory array 99, instructions exhibiting errors may not be executed (e.g., instructions that result in an asserted $V_{ERROR}$ will not be fulfilled). Host circuit 102 may keep track of the number of instructions that are successfully executed by monitoring the frequency at which signal $V_{ERROR}$ is asserted. When errors are detected, host circuit 102 may resend the entire bit stream Bpr or may only resend the failing instruction(s) without having to resend the entire bit stream Bpr. If desired, circuit 108 may also be configured correct an erroneous instruction. Operated in this way, PR control circuit 104 may be allowed to execute corrected PR instructions without having to resend the entire bit stream Bpr.

When it is desired to load new data into a selected frame, error checking circuit 108 may provide partial reconfiguration data Dpr extracted from the "data" portion of the current instruction. Control circuit 104 may include a configurable logic circuit such as Boolean logic circuit 116. Data Dold (e.g., old data bits that are stored in register DRA) and Dpr may be fed in serial fashion to first and second inputs of logic circuit 116, respectively. Configurable logic circuit 116 may be configured to provide desired Boolean logic functions such as a logic AND function, a logic OR function, a logic XOR function, a logic NAND function, a logic NOR function, a logic XNOR function, and/or other suitable logic functions.

For example, consider a first scenario in which logic circuit 116 is configured as a two-input logic AND gate. Logic AND gate 116 may receive at its first input data bit Dold that is shifted from an output of register DRA via path 120, may receive at its second input data bit Dpr that is shifted from error checking circuit 108, and may generate at its output data bit Dnew that is shifted back into an input of register DRA via path 118, where data bit Dnew is equal to the logic AND product of the currently received Dold and Dpr.

As another example, consider a second scenario in which logic circuit 116 is configured as a two-input logic XOR gate. Logic XOR gate 116 may receive at its first input data bit Dold that is shifted from the output of register DRA via path 120, may receive at its second input data bit Dpr that is shifted from error checking circuit 108, and may generate at its output data bit Dnew that is shifted back into the input of register DRA via path 118, where data bit Dnew is equal to the logic XOR product of the currently received Dold and Dpr. Register DRA may therefore be modified in a circular shift fashion based on the content of its old data Dold, the content of data Dpr provided from host circuit 102, and the Boolean logic function that is currently being implemented by logic circuit 116. The contents of register DRA after modification may therefore represent reconfiguration bits that will be loaded into a corresponding frame in memory array 99.

FIG. 6 is a table of illustrative instruction types that can be assigned to the opcode portion of each PR instruction. As shown in FIG. 6, the different types of instructions may include at least: SKIP_LEFT, SKIP_RIGHT, CLEAR_AR, SELECT_FRAME0, LOAD_FIRST_PR_FRAME, WRITE_LAST_PR_FRAME, AND, OR, XOR, SCRUB, AND PR_DONE. A SKIP_LEFT instruction may result in circuit 104 generating control signals (e.g., control signals Clk and/or Vctrl) that direct address register 106 to skip the current frame by moving the address pointer left. The data bits associated with a SKIP_LEFT instruction may indicate the number of frames to be shifted (e.g., the address pointer may be shifted to the left by an amount that is proportional to the value of the associated data bits). A SKIP_RIGHT instruction may result in circuit 104 generating control signals that direct address register 106 to skip the current frame by moving the address pointer right. The data bits associated with a SKIP_RIGHT instruction may indicate the number of frames to be shifted (e.g., the address pointer may be shifted to the right by an amount that is proportional to the value of the associated data bits).

A CLEAR_AR instruction may result in circuit 104 generating control signals that result in clearing the contents of address register 106 so that no frames are selected. For example, each flip-flop in register 106 may be reset to store a default value of zero. A SELECT_FRAME0 instruction may result in circuit 104 generating control signals that direct address register 106 to select the first frame of memory array 99. For example, a logic "1" may be shifted into a leading (first) flip-flop in address register 106 that supplies a first address signal to the first row of memory cells 20 in array 99. The SELECT_FRAME0 instruction is typically executed following the CLEAR_AR instruction.

A LOAD_FIRST_PR_FRAME instruction may direct circuit 104 to generate control signals that result in loading register DRLA with read data from a first frame of a partial reconfiguration region in memory array 99. A partial reconfiguration region may refer to a series of consecutive frames within memory array 99 that should be reconfigured during the partial reconfiguration operation (see, e.g., partial reconfiguration region 101 in FIG. 4). As shown in FIG. 4, the first frame of PR region 101 need not be the same frame as the first frame of memory array 99. Region 101 may include a single frame, two consecutive frames, or more than two consecutive frames. In the scenario in which region 101 contains only a single frame, the first PR frame is equivalent to that single frame. If desired, memory array 99 may include multiple non-overlapping PR regions 101 that are modified during partial reconfiguration procedures (e.g., multiple sets of consecutive frames may be reconfigured using partial reconfiguration circuitry 100).

A WRITE_LAST_PR_FRAME instruction may direct circuit 104 to generate control signals that result in loading the contents of register DRB into the last frame in PR region 101. In the scenario in which region 101 contains only a single frame, the last PR frame is equivalent to that single frame.

A logic AND instruction may configure logic circuit 116 to implement the logic AND function (e.g., bit Dnew produced at the output of logic circuit 116 may be equal to the logic AND product of bit Dold received at its first input and bit Dpr received at its second input). A logic OR instruction may configure logic circuit 116 to implement the logic OR function (e.g., bit Dnew produced at the output of logic circuit 116 may be equal to the logic OR product of bit Dold received at its first input and bit Dpr received at its second input). A logic XOR instruction may configure logic circuit 116 to implement the logic XOR function (e.g., bit Dnew produced at the output of logic circuit 116 may be equal to the logic XOR product of bit Dold received at its first input and bit Dpr received at its second input). A SCRUB instruction may simply set bit Dnew equal to bit Dpr that is provided at the output of error checking circuit 108 (e.g., Dnew is refreshed according to the user-specified data Dpr without regard to existing data Dold). If desired, Boolean instructions other than the types listed in the table of FIG. 6 may be supported by control logic circuit 116. Data bits Dpr that are received at the second input of logic circuit 116 may be included in the data portion of each instruction having instruction types 202 (see, FIG. 6).

When the instruction type is equal to one of the available logic operations 202, the opcode may further include the PR frame type. As shown in FIG. 7, the different types of PR frames may include at least: a SINGLE PR frame type identifier, a FIRST PR frame type identifier, a LAST PR frame type identifier, and a REGULAR PR frame type identifier. The SINGLE PR frame type identifier indicates that the PR region only includes a single frame and that the single frame is the currently selected frame. The FIRST PR frame type identifier indicates that the currently selected frame is the first frame in a PR region that includes at least two consecutive frames. The LAST PR frame type identifier indicates that the currently selected frame is the last frame in the PR region with at least two consecutive frames. The REGULAR PR frame type identifier indicates that the currently selected frame is a frame that is neither the first frame nor the last frame in a PR region with at least three consecutive frames.

A PR_DONE instruction may indicate that partial reconfiguration for memory array 99 is complete. The different instruction types and PR frame types described in connection with FIGS. 6 and 7 are merely illustrative and do not serve to limit the scope of the present invention. If desired, PR host circuit 102 and control circuit 104 may be configured to handle any suitable types of instructions and PR frame types.

Figure 8:
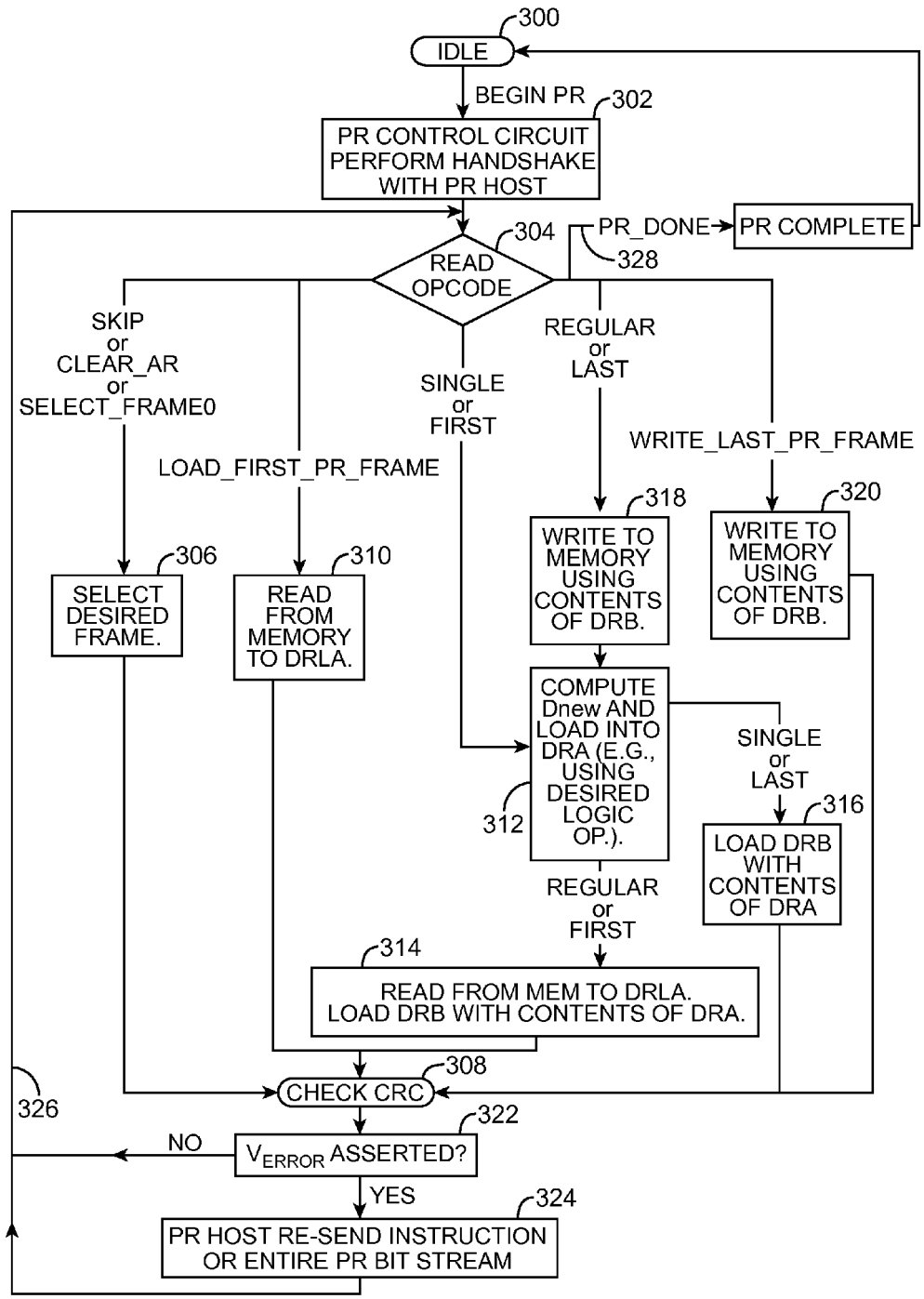
FIG. 8 is a flow chart of illustrative steps for operating the partial reconfiguration circuitry of FIG. 4 in accordance with an embodiment of the present invention.

FIG. 8 is a flow chart of illustrative steps for operating partial reconfiguration circuitry 100. Array 99 may be placed in an idle state 300 (e.g., the logic circuits that are being controlled using array 99 may be temporarily placed in idle mode). To initiate partial reconfiguration operations, host circuit 102 may perform handshake procedures with control circuit 204 by conveying control signals $V_{HANDSHAKE}$ via path 110 (step 302). Once handshake is complete, PR host circuit 102 may begin transmitting instruction bit stream Bpr to PR control circuit 104 via path 114.

At step 304, control circuit 104 may examine the opcode of the most recent unread instruction. If the opcode indicates a SKIP (i.e., SKIP_LEFT or SKIP_RIGHT), CLEAR_AR, or SELECT_FRAME0 instruction type, address register 106 may be configured to select the appropriate frame (step 306). For example, address register 306 may shift an asserted address signal left or right by the desired amount, may be reset to store all logic zeroes, or may be configured to select the first frame of array 99. If the opcode indicates a LOAD_FIRST_PR_FRAME instruction type, a selected frame may be read from array 99 into look-ahead register DRLA (step 310). If the opcode indicates a WRITE_LAST_PR_FRAME instruction type, the contents of register DRB may be written into a selected frame in memory array 99 (step 320).

If the opcode indicates one of logic operations 202 and has a SINGLE or FIRST partial reconfiguration frame type, data Dnew may be computed according to the designated logic function and may be shifted into register DRA using the circular shifting mechanism as described in connection with FIG. 4 (step 312). If the opcode indicates one of logic operations 202 and has a REGULAR or LAST partial reconfiguration frame type, the contents of register DRB may be written into a selected frame in memory array 99 (step 318). Step 318 may be subsequently followed by step 312.

Upon completion of step 312, processing may proceed to one of steps 314 and 316. If the opcode indicates a REGULAR or FIRST frame type, a selected frame may be read from array 99 into look-ahead register DRLA, and the contents of register DRA may be shifted in parallel into register DRB (step 314). If the opcode indicates a SINGLE or LAST frame type, the contents of register DRA may be shifted in parallel into register DRB without having to load register DRLA with read data (step 316).

When either one of steps 306, 310, 314, 316, or 320 is completed, error checking circuit 108 may be used to perform CRC error checking (step 308). If the current instruction does not contain any errors, signal V ERROR may remain deasserted, and processing may loop back to step 304 to evaluate a subsequent instruction in bit stream Bpr (as indicated by path 326). If the current instruction does contain at least one error, signal VERROR may be asserted, and PR host circuit 102 may presently resend the current instruction (or optionally at a later time) or may resend the entire PR bit stream Bpr (step 324). Processing may then loop back to step 304, as indicated by path 326.

Figure 9A:
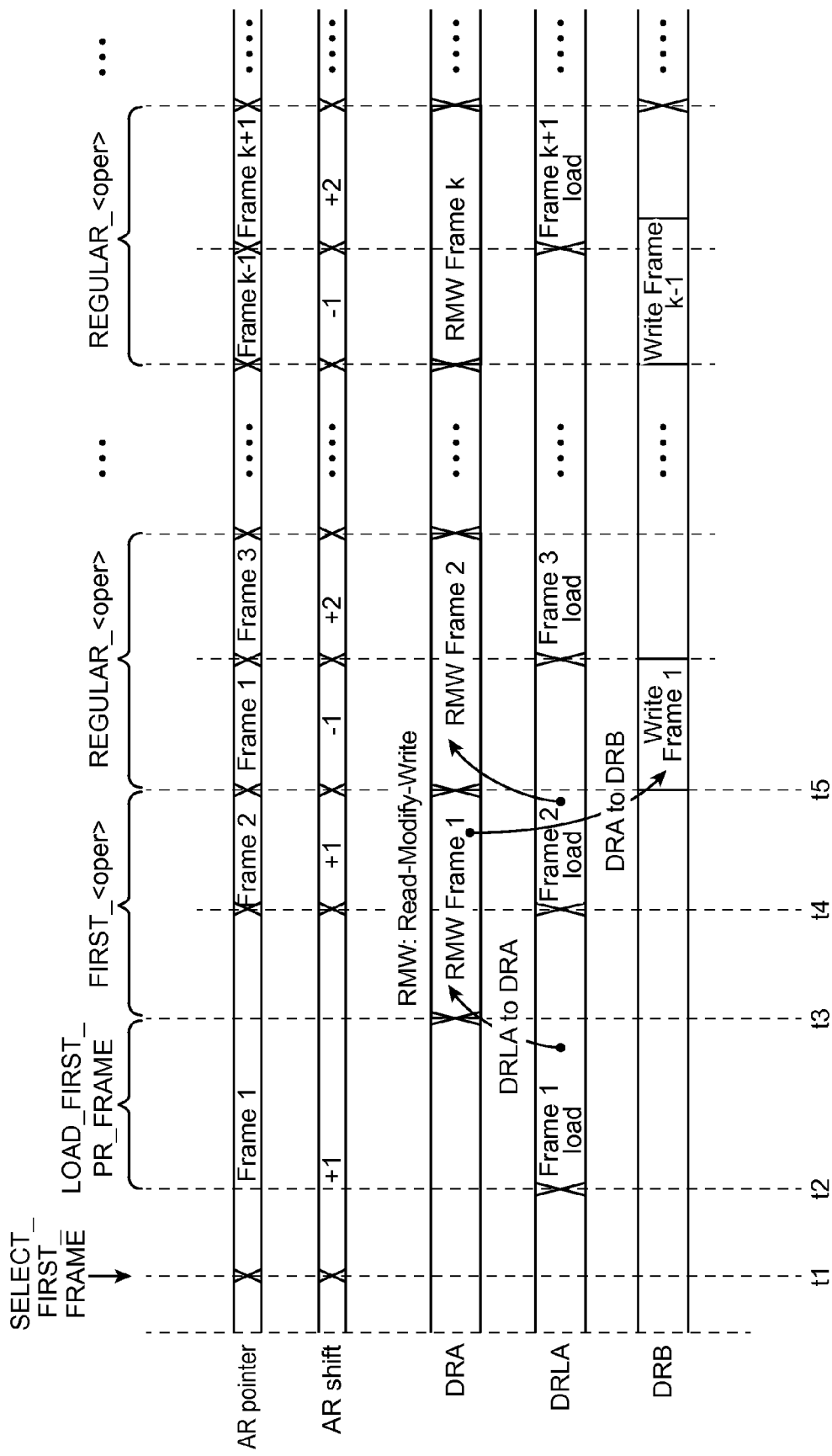
FIGS. 9A and 9B are timing diagrams showing the behavior of control signals and associated data flow during operation of the partial reconfiguration circuitry of FIG. 4 in accordance with an embodiment of the present invention.
Figure 9B:
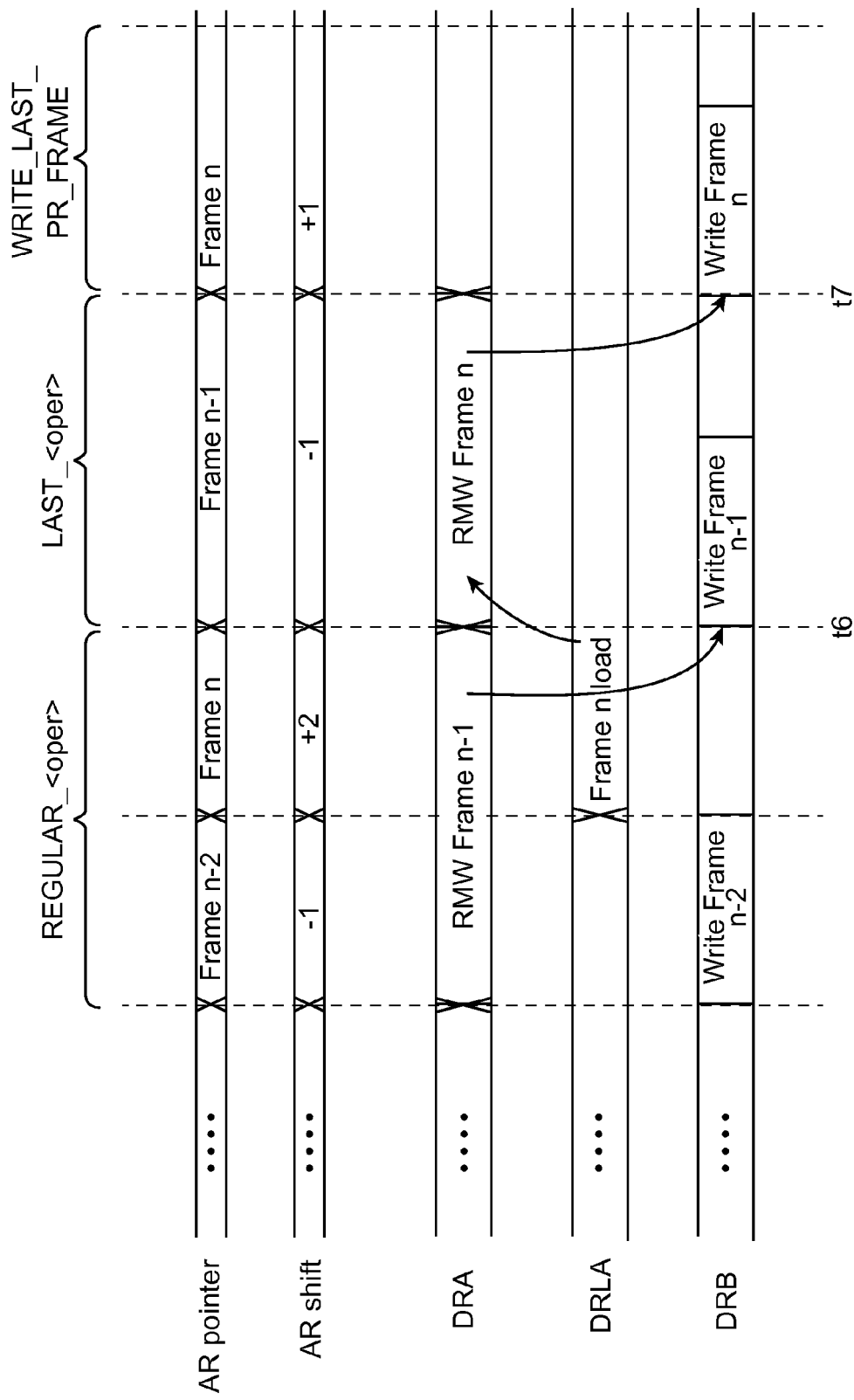

FIGS. 9A and 9B are timing diagrams showing the behavior of control signals and associated data flow during operation of partial reconfiguration circuitry 100. Prior to time t1, a CLEAR_AR instruction may be performed (see, e.g., FIG. 9A). At time t1, a SELECT_FIRST_FRAME instruction may be performed (e.g., the address register pointer may be pointing to the first frame in memory array 99 by shifting in a logic "1" into the leading flip-flop in address register 106).

At time t2, a LOAD_FIRST_PR_FRAME instruction may be performed. In particular, the contents of the first frame may be read into register DRLA. At time t3, an instruction with a FIRST frame type and an associated logic operation <oper> may be used to compute Dnew. Operation <oper> may be any selected one of Boolean logic functions 202 (FIG. 6). In particular, the contents of register DRLA are shifted in parallel into register DRA, and the contents of register DRA are then modified and rewritten into register DRA using the circular shift mechanism described in connection with FIG. 4. Populating register DRA with modified data bits Dnew in this way may sometimes be referred to as performing a read-modified write (RMW). At time t4, the address register pointer shifts one to the right to point at the second frame of array 99, and the second frame is loaded into register DRLA. At the end of this instruction, the contents of register DRA may be shifted into register DRB.

At time t5, an instruction with a REGULAR frame type and an associated <oper> may be used to compute Dnew. At this time, the contents of register DRB may be written into the "previous" frame (e.g., the first frame) by momentarily shifting the address pointer one to the left. The contents of register DRLA are then shifted in parallel into register DRA, and register DRA is repopulated using a read-modified write based on the selected <oper>. Register DRLA may then proceed to read the "next" frame (i.e., the third frame in memory array 99) by shifting the address pointer right two.

A series of instructions with REGULAR frame types may then be evaluated and executed. The series of instructions with REGULAR frame types may be followed by an instruction with a LAST frame type (see, time t6 in FIG. 9B). Towards the end of the last REGULAR instruction, the modified contents of register DRA (that is currently storing reconfiguration bits for the [n−1]$^{th}$ frame) may be shifted in parallel into register DRB. At time t6, the modified contents of DRB currently storing the reconfiguration bits may be written into the (n−1)$^{th}$ frame while register DRLA loads the content that was read from the n$^{th}$ frame into register DRA to be modified using <oper> associated with the LAST instruction. At the end of the LAST instruction, the modified contents of register DRA (that is currently storing reconfiguration bits for the n$^{th}$ frame) may be shifted in parallel into register DRB.

At time t7, a WRITE_LAST_PR_FRAME instruction may be performed. In particular, the address pointer may be pointing to the n$^{th}$ frame (i.e., the last frame in PR region 101), and the contents of register DRB may be loaded into the n$^{th}$ frame. The WRITE_LAST_PR_FRAME instruction can then be followed by a SKIP instruction to reconfigure another target PR region or may be followed by a PR_DONE to signify completion of the partial reconfiguration procedure. If desired, host circuit 102 may initiate partial reconfiguration at any point in time during operation of device 10 to reconfigure any desired portion(s) of array 99.

The sequence of instructions as shown in FIGS. 9A and 9B in which more than two consecutive frames are being reconfigured is merely illustrative. Consider another example in which PR region 101 only includes two frames. A suitable instruction bit stream for such scenario may include instructions in this following order: LOAD_FIRST_PR_FRAME, FIRST_<oper>, LAST_<oper>, WRITE_LAST_PR_FRAME, and PR_DONE (or SKIP if there is another non-adjacent PR region to be reconfigured). Consider another example in which PR region 101 only includes a single frame. A suitable instruction bit stream for such scenario may include instructions in this following order: LOAD_FIRST_PR_FRAME, SINGLE_<oper>, WRITE_LAST_PR_FRAME, and PR_DONE (or SKIP). Generally, any number of memory arrays 99 in device 10 may be partially reconfigured using the illustrative approach described here.

Figure 10:
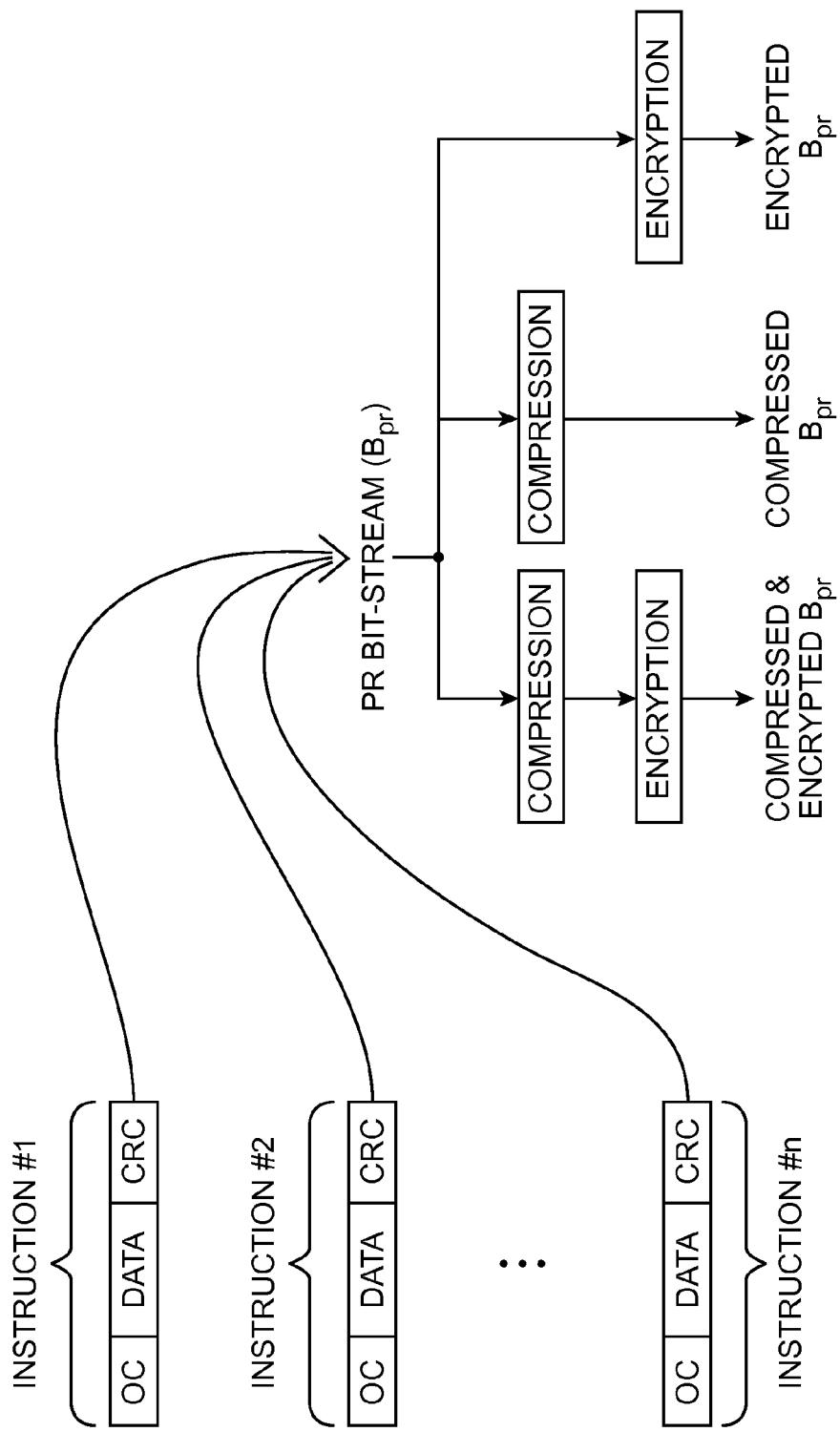
FIG. 10 is a diagram showing how partial reconfiguration instructions may be compressed and/or encrypted in accordance with an embodiment of the present invention.

In some embodiments of the present invention, bit stream Bpr may be compressed and/or encrypted (see, e.g., FIG. 10). The instructions may be compressed using a compression algorithm such as the LZ77 algorithm, Huffman encoding, arithmetic coding based algorithms, or other known data compression algorithms. The instructions may be encrypted using an encryption algorithm such as the Advance Encryption Standard (AES) 128 algorithm or the AES 256 algorithm (as examples). In one suitable arrangement, bit stream Bpr may be compressed and encrypted. In another suitable arrangement, bit stream Bpr may only be compressed. In another suitable arraignment, bit stream Bpr may only be encrypted.

Figure 11:
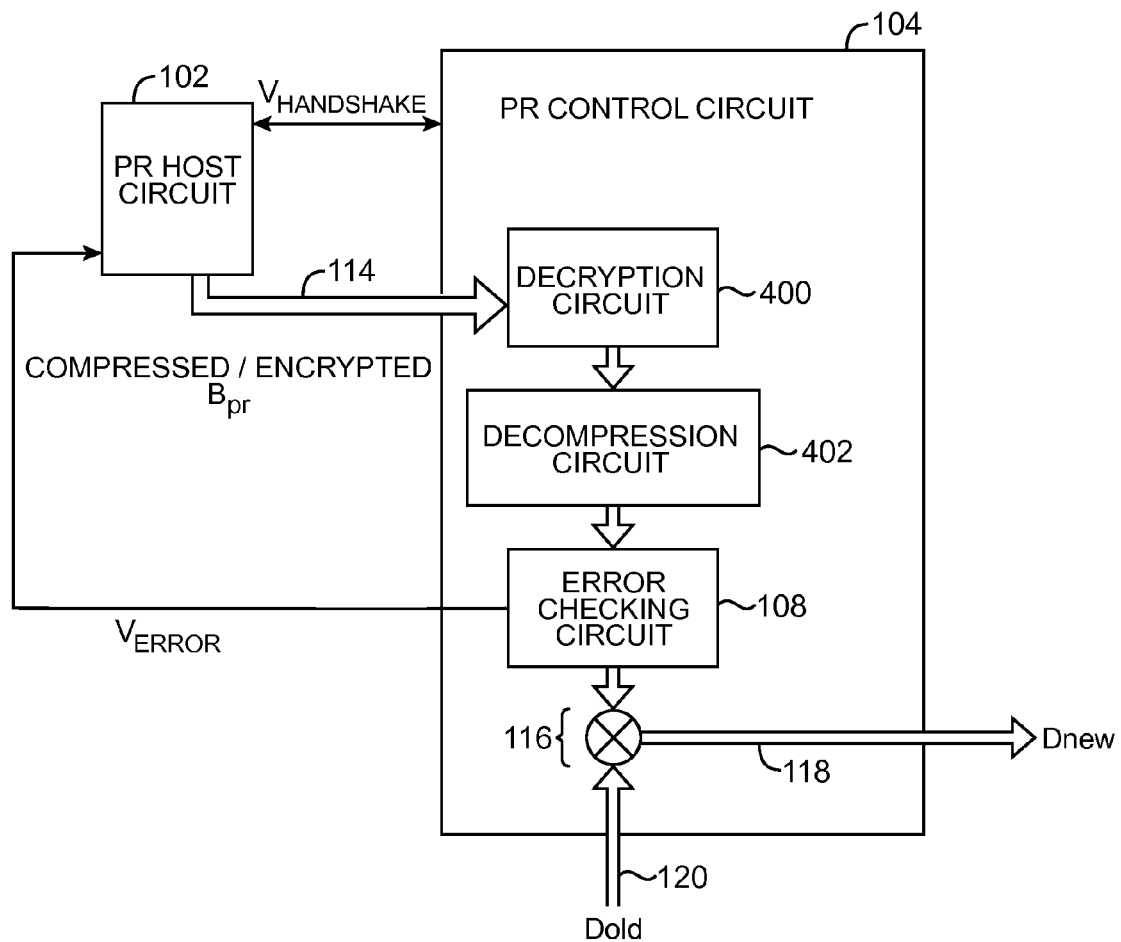
FIG. 11 is a diagram of an illustrative partial reconfiguration control circuit having a decryption circuit, a decompression circuit, and an error checking circuit in accordance with an embodiment of the present invention.

As shown in FIG. 11, control circuit 104 may include (in addition to error checking circuit 108) a decryption circuit such as decryption circuit 400 and a decompression circuit such as decompression circuit 402. Decryption circuit 400 may be used to perform decryption on an encrypted Bpr. Decompression circuit 402 may be used to perform decompression on a compressed Bpr. In the scenario in which instruction stream Bpr is both compressed and encrypted, stream Bpr may be passed through both circuits 400 and 402 (e.g., both circuits 400 and 402 may be activated). In the scenario in which instruction stream Bpr is only compressed but not encrypted, stream Bpr may be passed through only circuit 402 while bypassing circuit 400 (e.g., circuit 402 may be switched into use while circuit 400 may be switched out of use). In the scenario in which instruction stream Bpr is only encrypted but not compressed, stream Bpr may be passed through only circuit 400 while bypassing circuit 402 (e.g., circuit 400 may be switched into use while circuit 402 may be switched out of use).

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   an array of memory elements; and
   partial reconfiguration circuitry that is coupled to the array of memory elements, wherein the partial reconfiguration circuitry comprises:
      a control circuit; and
      data register circuitry that stores data that is read from a selected row of memory elements in the array of memory elements and to modify the read data to produce modified data, wherein the control circuit loads the modified data from the data register circuitry into the selected row of memory elements in the array of memory elements, wherein the control circuit includes a configurable logic circuit that produces the modified data by using the configurable logic circuit to implement a logic function selected from the group consisting of: a logic AND function, a logic OR function, a logic XOR function, a logic NAND function, a logic NOR function, and a logic XNOR function.

2. The integrated circuit defined in claim 1, wherein the partial reconfiguration circuitry further comprises:
   an address register that is controlled by the control circuit, wherein the address register generates an asserted address signal corresponding to the selected row of memory elements.

3. The integrated circuit defined in claim 1, wherein the partial reconfiguration circuitry further comprises:
   a host circuit that provides a plurality of partial reconfiguration instructions to the control circuit.

4. The integrated circuit defined in claim 1, wherein the control circuit also receives a plurality of partial reconfiguration instructions and wherein the control circuit includes an error checking circuit that determines whether each instruction in the plurality of partial reconfiguration instructions includes errors and to correct the errors in the partial reconfiguration instructions.

5. An integrated circuit comprising:
   an array of memory elements; and
   partial reconfiguration circuitry that is coupled to the array of memory elements, wherein the partial reconfiguration circuitry comprises:
      a control circuit; and
      data register circuitry that stores data that is read from a selected row of memory elements in the array of memory elements and to modify the read data to produce modified data, wherein the control circuit loads the modified data from the data register circuitry into the selected row of memory elements in the array of memory elements, wherein the control circuit also receives a plurality of partial reconfiguration instructions, and wherein the control circuit includes a configurable logic circuit that produces the modified data based on a given partial reconfiguration instruction in the plurality of partial reconfiguration instructions.

6. The integrated circuit defined in claim 5, wherein the configurable logic circuit includes a first input that receives the read data from an output of the data register circuitry, a second input that receives new data extracted from the given partial reconfiguration instruction, and an output at which the modified data is provided to an input of the data register circuitry.

7. The integrated circuit defined in claim 5, wherein the data register circuitry comprises:
   a first data register that stores the read data;
   a second data register that receives the read data from the first data register, wherein the control circuit is configured to modify the read data to produce the modified data in the second data register; and
   a third data register that receives the modified data from the second data register, wherein the control circuit is configured to load the modified data from the third data register into the selected row of memory elements in the array of memory elements and wherein the configurable logic circuit implements a logic function selected from the group consisting of: a logic AND function, a logic OR function, a logic XOR function, a logic NAND function, a logic NOR function, and a logic XNOR function.

8. The integrated circuit defined in claim 1, wherein the control circuit also receives at least one compressed partial reconfiguration instruction, and wherein the control circuit includes a decompression circuit that decompresses the at least one compressed partial reconfiguration instruction.

9. The integrated circuit defined in claim 1, wherein the control circuit also receives at least one encrypted partial reconfiguration instruction, and wherein the control circuit includes a decryption circuit that decrypts the at least one encrypted partial reconfiguration instruction.

10. A method of operating partial reconfiguration circuitry that is coupled to an array of memory elements, wherein the partial reconfiguration circuitry and the array of memory elements are formed on an integrated circuit, and wherein the partial reconfiguration circuitry includes a control circuit, an address register, and data register circuitry, the method comprising:
   with the control circuit, receiving a plurality of partial reconfiguration instructions, wherein a given partial reconfiguration instruction in the plurality of partial reconfiguration instructions includes partial reconfiguration memory data;
   reading data from a selected row of memory elements in the array of memory elements and loading the read data into a first data register in the data register circuitry;
   loading the read data from the first data register to a second data register in the data register circuitry;
   modifying the read data that is stored in the data register circuitry based at least partially on the read data and the partial reconfiguration memory data, wherein the control circuit includes a configurable logic circuit and wherein modifying the read data that is stored in the data register circuitry comprises generating the modified data with the configurable logic circuit and serially shifting the modified data that is generated by the logic circuit into the second data register; and
   loading the modified data into the selected row of memory elements.

11. The method defined in claim 10, wherein the configurable logic circuit has first and second inputs, the method further comprising:
   with the first input of the configurable logic circuit, serially receiving the read data from an output of the second data register; and
   with the second input of the configurable logic circuit, serially receiving the partial reconfiguration memory data.

12. The method defined in claim 11, wherein generating the modified data comprises:
   using the configurable logic circuit to implement a logic function selected from the group consisting of: a logic AND function, a logic OR function, a logic XOR function, a logic NAND function, a logic NOR function, and a logic XNOR function; and
   generating the modified data by performing the selected logic function on the received read data and the received partial reconfiguration memory data.

13. The method defined in claim 10, wherein the partial reconfiguration circuitry further includes a host circuit, and wherein receiving the plurality of partial reconfiguration instructions comprises:
   with the control circuit, receiving the plurality of partial reconfiguration instructions from the host circuit.

14. The method defined in claim 10, wherein the control circuit includes an error checking circuit having an output, the method further comprising:
   with the error checking circuit, determining whether the given partial reconfiguration instruction contains an error; and
   in response to determining that the given partial reconfiguration instruction is erroneous, asserting an error signal at the output of the error checking circuit.

15. The method defined in claim 10, wherein the plurality of partial reconfiguration instructions comprises a series of encrypted instructions, and wherein the control circuit includes a decryption circuit, the method further comprising:
   with the decryption circuit, decrypting the series of encrypted instructions.

16. The method defined in claim 10, wherein the plurality of partial reconfiguration instructions comprises a series of compressed instructions, and wherein the control circuit includes a decompression circuit, the method further comprising:
   with the decompression circuit, decompressing the series of compressed instructions.

17. A method of operating partial reconfiguration circuitry that is coupled to an array of memory elements and that includes a control circuit and a host circuit, wherein the partial reconfiguration circuitry and the array of memory elements are formed on an integrated circuit, the method comprising:
   with the control circuit, receiving a series of partial reconfiguration instructions from the host circuit;
   with an error checking circuit in the control circuit, determining whether a given partial reconfiguration instruction in the series of partial reconfiguration instructions contains an error; and
   in response to determining that the given partial reconfiguration instruction is erroneous, preventing the given partial reconfiguration instruction from being executed on the array of memory elements and resending only the given partial reconfiguration with the host circuit to the control circuit.

18. The method defined in claim 17, further comprising:
   in response to determining that the given partial reconfiguration instruction is erroneous, using the control circuit to provide an asserted error signal to the host circuit.

19. The method defined in claim 18, wherein the series of partial reconfiguration instructions comprises partial reconfiguration instructions that are encrypted and compressed, and wherein the control circuit includes a decryption circuit and a decompression circuit, the method further comprising:
   with the decryption circuit, decrypting the partial reconfiguration instructions; and
   with the decompression circuit, decompressing the partial reconfiguration instructions.

* * * * *